United States Patent [19]
Yamamoto et al.

[11] Patent Number: 5,142,241
[45] Date of Patent: Aug. 25, 1992

[54] DIFFERENTIAL INPUT CIRCUIT

[75] Inventors: Ryuichiro Yamamoto; Hiromi Saito; Tomonori Morita, all of Kanagawa, Japan

[73] Assignee: NEC Corporation, Tokyo, Japan

[21] Appl. No.: 744,087

[22] Filed: Aug. 12, 1991

[30] Foreign Application Priority Data

Aug. 31, 1990 [JP] Japan .................. 2-232122

[51] Int. Cl.⁵ .................. H03F 3/45
[52] U.S. Cl. .................. 330/253; 330/261; 330/301
[58] Field of Search .................. 330/117, 148, 253, 261, 330/275, 301

[56] References Cited

U.S. PATENT DOCUMENTS 4,963,835 10/1990 Saitoh .................. 330/253

Primary Examiner—James B. Mullins
Attorney, Agent, or Firm—Helfgott & Karas

[57] ABSTRACT

A differential input circuit includes a first bias generating circuit, a second bias generating circuit, a differential circuit, a first capacitor, and a second capacitor. The first bias generating circuit applies an input signal and a bias voltage divided by first dividing resistors to a first source follower FET and outputs a resultant value through first level shift diodes. The second bias generating circuit applies a bias voltage divided by second dividing resistors to a second source follower FET and outputs a resultant value through second level shift diodes. The differential circuit includes first and second switching FETs respectively having gates connected to outputs of the first and second bias generating circuits. The first capacitor connects the output of the first switching FET to a gate electrode of the second switching FET. The second capacitor connects an output terminal of the second bias generating circuit to a gate electrode of the second source follower FET.

4 Claims, 4 Drawing Sheets

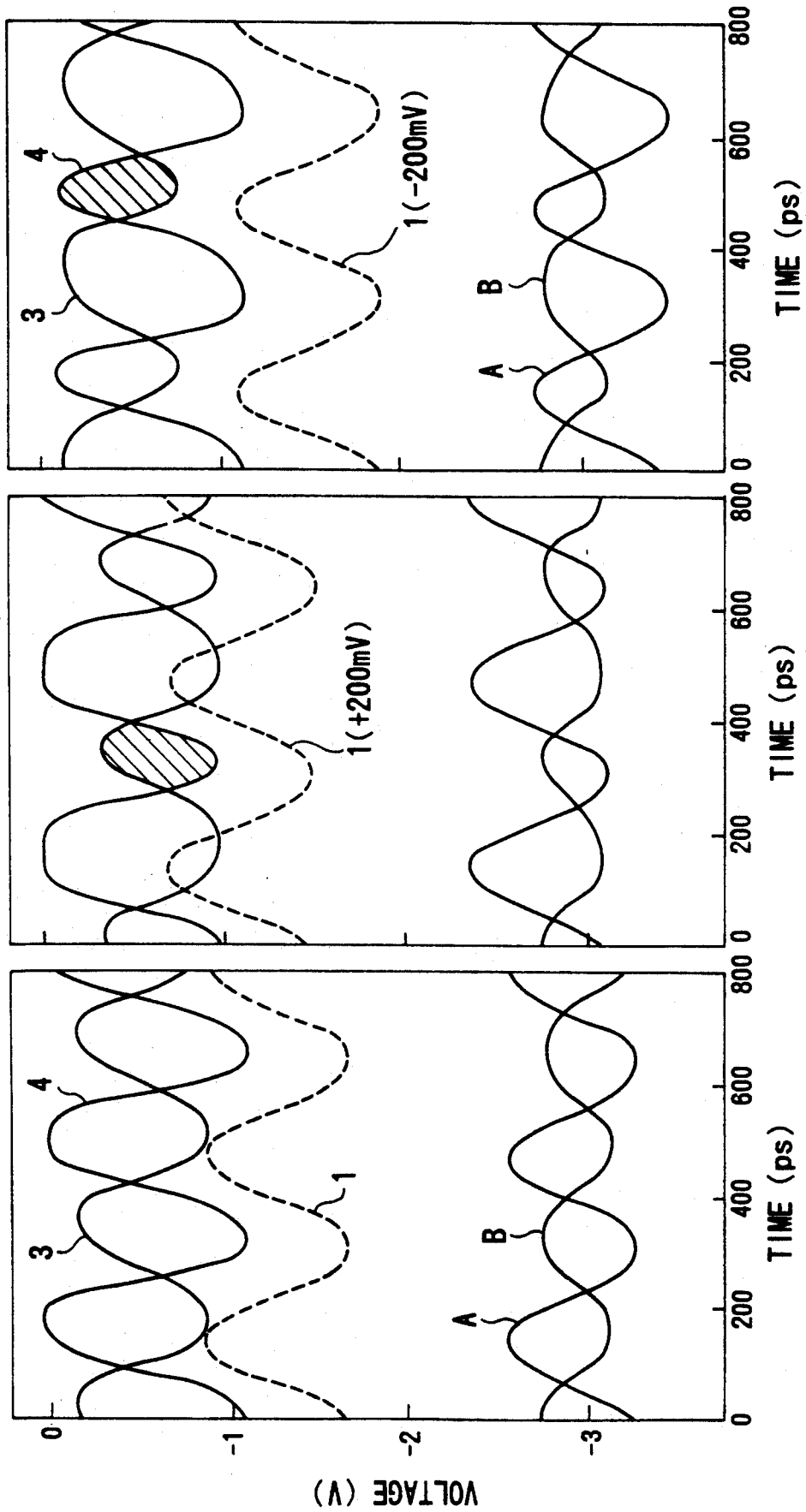

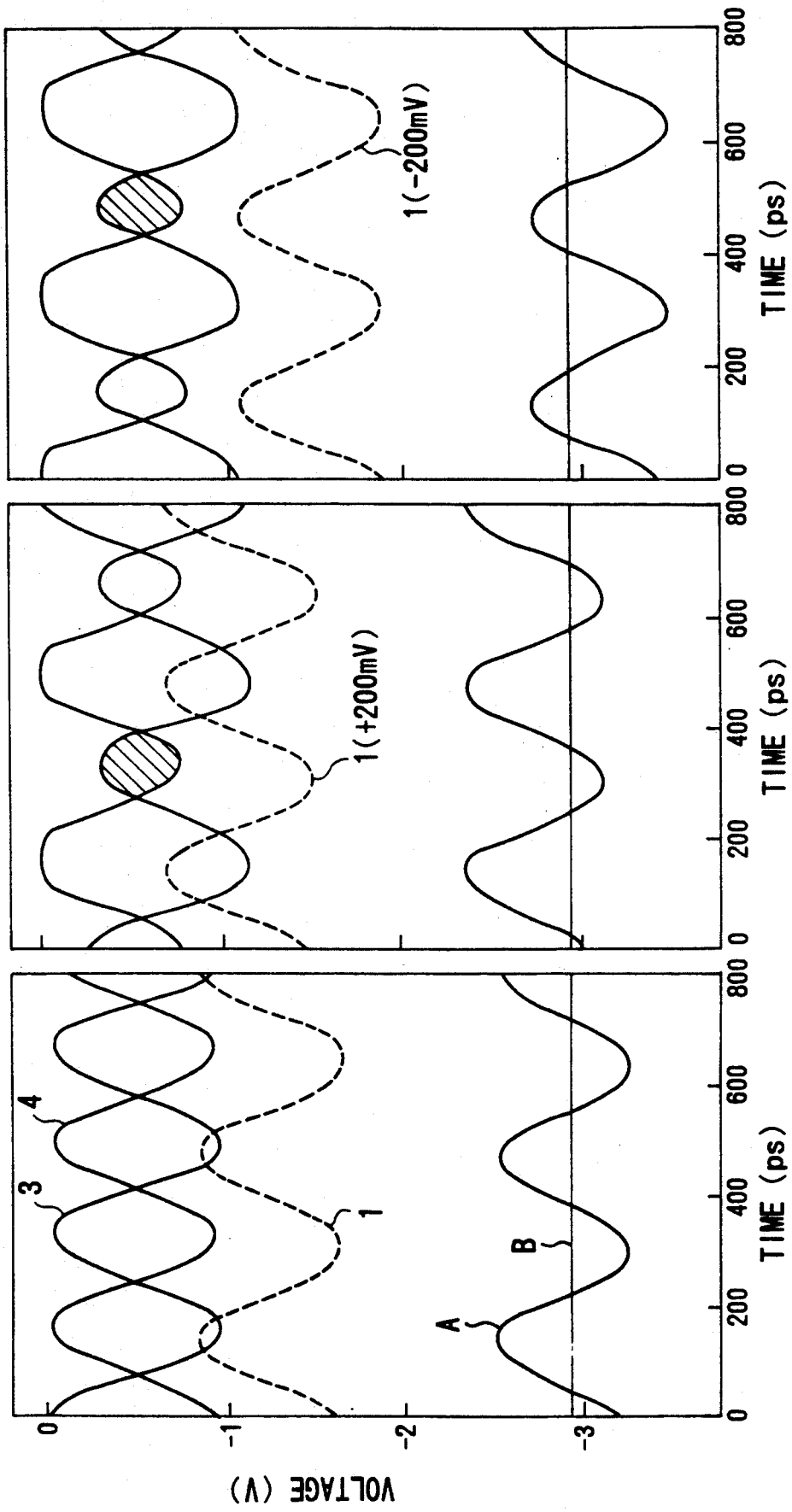

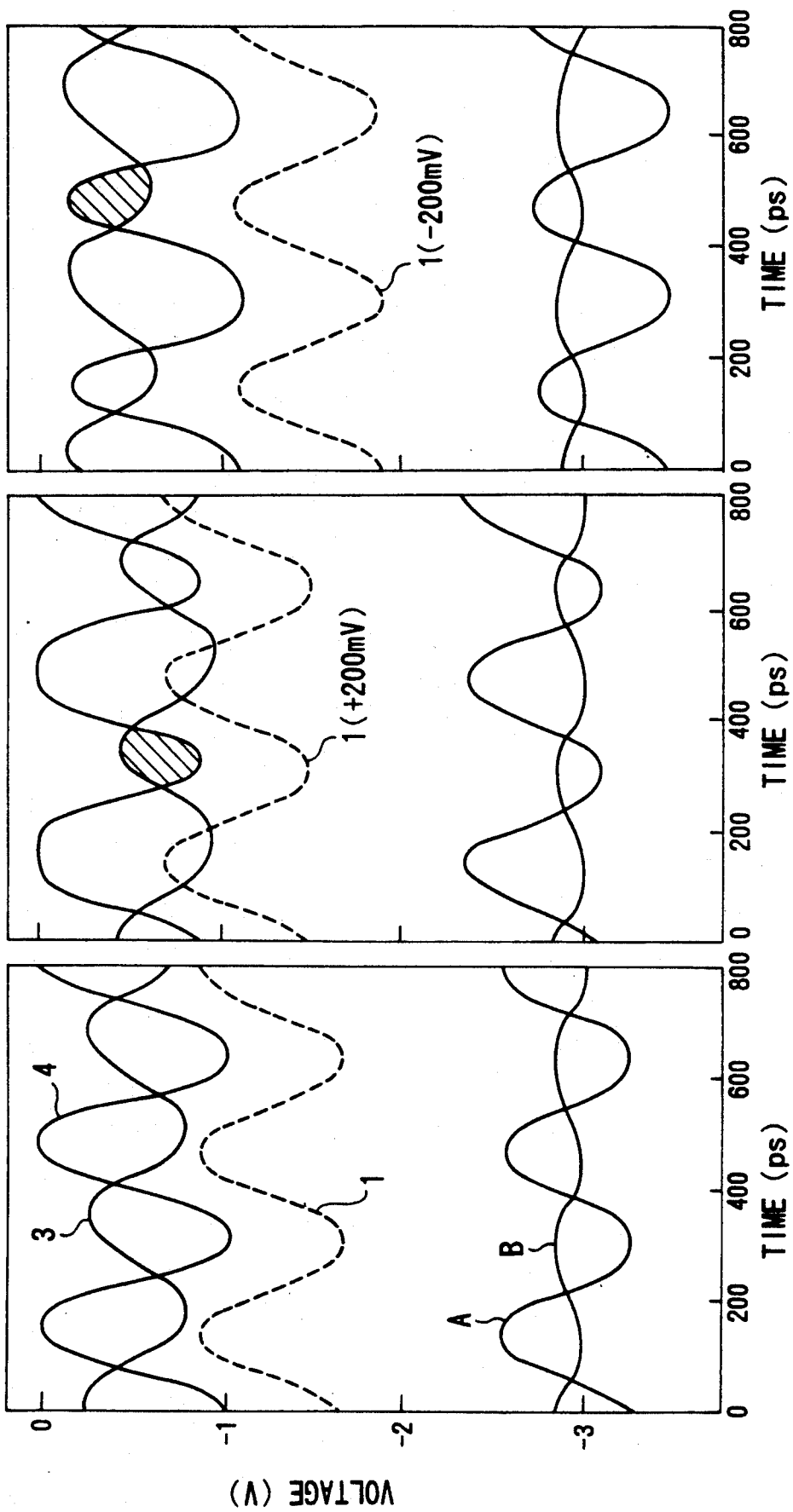

DIFFERENTIAL INPUT CIRCUIT

BACKGROUND OF THE INVENTION

The present invention relates to a differential input circuit and, more particularly, to a single-phase type differential input circuit.

Conventional differential input circuits are classified into two types, i.e., single-phase and two-phase types. In a two-phase type input circuit, a large circuit gain can be set, and the input amplitude can be reduced accordingly. Therefore, the two-phase type input circuit is preferable. However, an input signal normally has a single phase, and a complicated circuit arrangement is required to obtain a two-phase input signal by generating an opposite-phase signal from the input signal. In addition, with an increase in input frequency, it becomes more difficult to generate a perfect opposite-phase signal. For these reasons, a single-phase type input circuit is currently used.

FIG. 3 shows a conventional single-phase type differential input circuit. Referring to FIG. 3, FETs $Q_1$ and $Q_2$ constitute a differential circuit 11 together with load resistors $R_1$ and $R_2$. An FET $Q_3$ serves as a constant current source for the differential circuit 11. FETs $Q_4$ and $Q_5$ and level shift diodes $D_1$ and $D_2$ constitute a first source follower type bias generating circuit 12. A gate bias is applied to the source follower FET $Q_4$ through dividing resistors $R_3$ and $R_4$. In addition, an output terminal A of the bias generating circuit 12 is connected to the gate electrode of the FET $Q_1$ so that an RF signal supplied to an input terminal 1 is supplied to the differential circuit 11 through the terminal A, thus performing a single-phase operation. A second bias generating circuit 13 is constituted by FETs $Q_6$ and $Q_7$ and level shift diodes $D_3$ and $D_4$. A gate bias is applied to the FET $Q_6$ through dividing resistors $R_5$ and $R_6$. In addition, an output terminal B of the bias generating circuit 13 is connected to the gate electrode of the FET $Q_2$ so that the gate bias serves as a reference voltage. Reference symbols $V_{DD}$ and $V_{SS}$ respectively denote power source terminals.

FIGS. 4a to 4c respectively show the results of computer simulation performed by the inventors of the present invention. More specifically, FIGS. 4a to 4c respectively show waveforms at the input terminal 1, the input terminals A and B of the differential circuit (reference voltage), and output terminals 3 and 4.

In the above-described conventional differential circuit, if a DC bias value at the input terminal 1 varies by ±200 mV with respect to the bias value shown in FIG. 2a, DC components at the output terminals 3 and 4 also vary, as show in FIGS. 4b and 4c. As a result, the symmetry of output waveforms is impaired.

According to the result of an experiment performed by using a device manufactured by the inventors of the present invention, if an overlapping portion of output waveforms (a hatched portion in each of FIGS. 4b and 4c) becomes 400 mV or less, a normal operation cannot be performed.

SUMMARY OF THE INVENTION

It is an object of the present invention to provide a differential input circuit which can improve the symmetry of high-frequency output waveforms.

It is another object of the present invention to provide a differential input circuit which can maintain a normal operation of a circuit arranged in a next stage.

It is an object of the present invention to provide a differential input circuit which is resistant to variations in input DC level.

In order to achieve the above objects, according to the present invention, there is provided a differential input circuit comprising a first bias generating circuit for applying an input signal and a bias voltage divided by first dividing resistors to a first source follower FET and outputting a resultant value through first level shift diodes, a second bias generating circuit for applying a bias voltage divided by second dividing resistors to a second source follower FET and outputting a resultant value through second level shift diodes, a differential circuit including first and second switching FETs respectively having gates connected to outputs of the first and second bias generating circuits, a first capacitor for connecting the output of the first switching FET to a gate electrode of the second switching FET, and a second capacitor for connecting an output terminal of the second bias generating circuit to a gate electrode of the second source follower FET.

BRIEF DESCRIPTION OF THE DRAWINGS

FIGS. 2a to 2c are charts showing waveforms as the results of computer simulation in the embodiment shown in FIG. 1;

FIGS. 4a to 4c and 5a to 5c are charts respectively showing waveforms as the results of computer simulation in the circuit shown in FIG. 3 and in its modification.

DESCRIPTION OF THE PREFERRED EMBODIMENT

The present invention will be described below with reference to the accompanying drawings.

Figure 1:
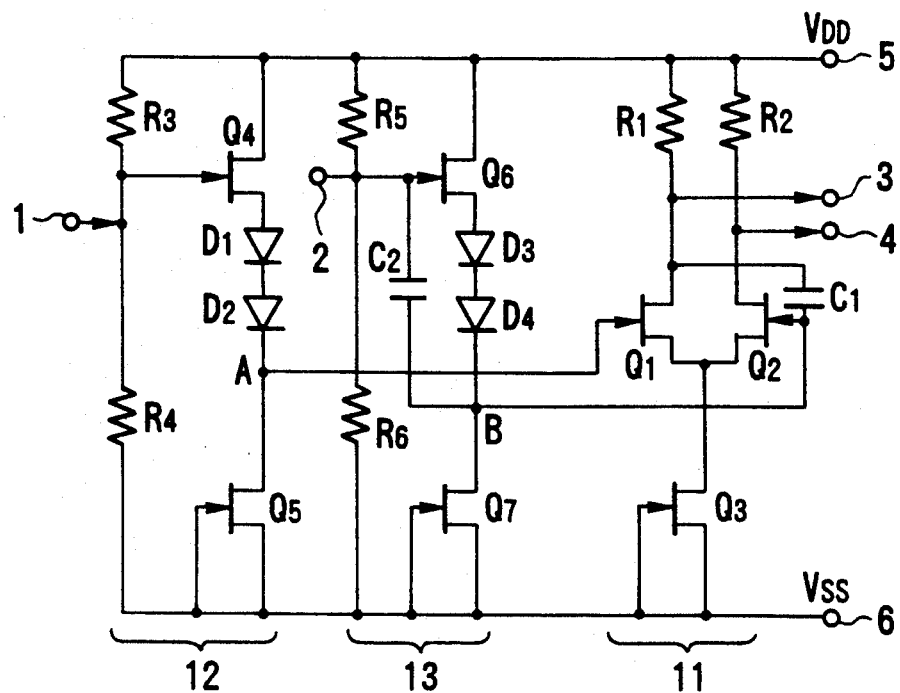
FIG. 1 is a circuit diagram showing an embodiment of the present invention.
Figure 3:
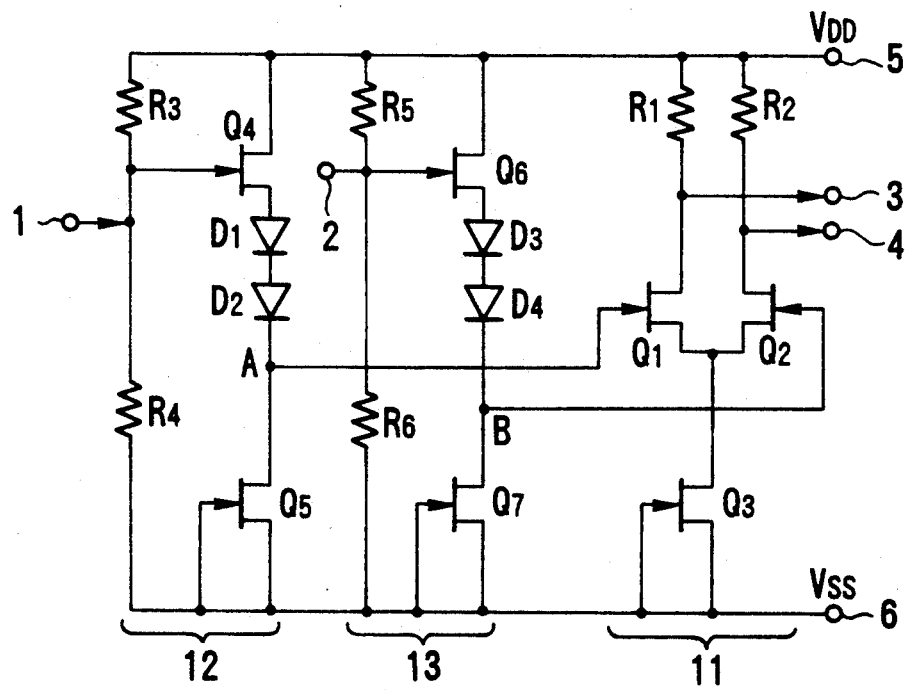
FIG. 3 is a circuit diagram showing a conventional differential input circuit.

FIG. 1 shows an embodiment of the present invention. This embodiment is equivalent to the conventional circuit (FIG. 3) except that a capacitor $C_1$ is arranged between the drain electrode (output terminal 3) of a switching FET $Q_1$ and the gate electrode of an FET $Q_2$, and a capacitor $C_2$ is arranged between the gate electrode of an FET $Q_6$ and a node B. Other components are the same as those of the circuit shown in FIG. 3.

The capacitor $C_1$ transmits a change in potential of the drain electrode (output terminal 3) of the FET $Q_1$ to the gate electrode of the FET $Q_2$. In this case, since a change in potential of the node (output terminal 3) is opposite in phase to a change in potential applied to the gate of the FET $Q_1$, the FETs $Q_1$ and $Q_2$ are operated in opposite phases. That is, this operation state is equivalent to a two-phase driving operation.

A case without the capacitor $C_2$ will be considered first. A larger potential change appearing at the gate electrode of the FET $Q_2$ through the capacitor $C_1$ is preferable, because a better two-phase driving operation can be performed with an increase in potential change. The potential change is increased with an increase in value of the capacitor $C_1$, because the loss in the capacitor $C_1$ is decreased. In this regard, therefore, the value of the capacitor $C_1$ is preferably as large as possible. However, in terms of a high-speed operation, i.e., in consideration of a time constant, the value of the capacitor $C_1$ is preferably set to be as small as possible. It is apparent from the above description that the value of the capacitor $C_1$ has its upper limit.

FIGS. 5a, 5b, and 5c respectively show the results of computer simulation in which each of load resistors $R_1$ and $R_2$ has a resistance of 750 Ω, each of the FETs $Q_1$ and $Q_2$ has a gate width of 20 μm, a mutual conductance is 300 mS/mm, the differential circuit has a threshold voltage of −0.5 V, and the capacitor $C_1$ has a capacitance of 0.5 pF. It is apparent from waveforms at input terminals A and B of the differential circuit that a two-phase driving operation is performed. It is also apparent that the amplitude of the waveform at the input terminal B is small, and that the waveform at the output terminal 3 exhibits a smaller amplitude than that in FIGS. 4a to 4c. That is, no significant improvement is made in terms of the size of an overlapping portion (a hatched portion in each of FIGS. 5b and 5c) of the waveforms at the output terminals 3 and 4 in a case wherein the DC bias value at the input terminal 1 varies by ±200 mV from the value shown in FIG. 5a. This is because an impedance at the node B as a bias point is too large.

A case wherein the capacitor $C_2$ is connected between the node B and the gate electrode of the FET $Q_6$ will be considered next. In this case, a current flowing in a second bias generating circuit 13 is made constant owing to the charge holding effect of the capacitor $C_2$, and a change in potential at the node B is absorbed by the FET $Q_6$ or $Q_7$. As a result, the potential at the node B, i.e., the gate potential of the FET $Q_2$ of the differential circuit, tends to change.

FIGS. 2a, 2b, and 2c respectively show the results of computer simulation which was actually performed while the value of the capacitor $C_2$ was set to be 0.5 pF. As is apparent from these graphs, the potential change at the node B is greatly improved as compared with the case shown in FIGS. 5a to 5c. In addition, an improvement is made in terms of the size of an overlapping portion (a hatched portion in each of FIGS. 2b and 2c) of the waveforms at the output terminals 3 and 4 in a case wherein the DC bias value at the input terminal 1 varies by ±200 mV from the value shown in FIG. 2a.

Assume that the DC bias value at the input terminal 1 varies by +200 mV. In this case, the overlapping portion of the waveforms at the output terminals 3 and 4 corresponds to 480 mV in the conventional circuit, as shown in FIG. 4b. In the circuit to which the only capacitor $C_1$ is added, the overlapping portion corresponds to 440 mV, as shown in FIG. 5b. However, in the circuit of this embodiment to which the two capacitors $C_1$ and $C_2$ are added, the overlapping portion corresponds to 640 mV, as shown in FIG. 2b. That is, the value of the overlapping portion in the circuit of the embodiment is larger than that in the conventional circuit by 160 mV.

As has been described above, the circuit of the present invention has high resistance to variations in input DC level so that even if the DC level of the input terminal varies due to any kind of internal or external factor, a large overlapping portion of waveforms can be ensured by preventing the DC levels of two opposite-phase outputs of the differential circuit from being separated from each other too far, thus maintaining the symmetry of the waveforms. With this operation, a normal operation of a differential circuit arranged in the next stage can be maintained.

What is claimed is:

1. A differential input circuit comprising:
   a first bias generating circuit including a first source follower FET, two first dividing resistors connected to an input terminal and to said first source follower FET, and two first level shift diodes connected to said first source follower FET, for applying an input signal and a bias voltage divided by said first dividing resistors to said first source follower FET and outputting a resultant value through said first level shift diodes.
   a second bias generating circuit including a second source follower FET, two second dividing resistors connected to said second source follower FET, and two second level shift diodes also connected to said second source follower FET, for applying a bias voltage divided by said second dividing resistors to said second source follower FET and outputting a resultant value through said second level shift diodes;
   a differential circuit including first and second switching FETs having gates respectively connected to outputs of said first and second bias generating circuits;
   a first capacitor for connecting an output of said first switching FET to a gate electrode of said second switching FET; and
   a second capacitor for connecting an output terminal of said second bias generating circuit to a gate electrode of said second source follower FET.

2. A circuit according to claim 1, wherein capacitance values of said first and second capacitors are determined in accordance with a time constant and a loss value of said circuit at a frequency used therefor.

3. A circuit according to claim 1, wherein said differential circuit comprises a constant current source, connected to a node between source electrodes of said first and second switching FETs, for supplying a constant current thereto.

4. A circuit according to claim 1, wherein said differential circuit comprises load resistors respectively connected to drain electrodes of said first and second switching FETs.

* * * * *